(12) United States Patent
Song et al.

(10) Patent No.: US 7,686,052 B2
(45) Date of Patent: Mar. 30, 2010

(54) LAMINATION APPARATUS AND LASER-INDUCED THERMAL IMAGING METHOD USING THE SAME

(75) Inventors: Myung-Won Song, Suwon-si (KR); Seong-Taek Lee, Suwon-si (KR); Mu-Hyun Kim, Suwon-si (KR); Byung-Doo Chin, Seongnam-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 153 days.

(21) Appl. No.: 11/020,667

(22) Filed: Dec. 27, 2004

(65) Prior Publication Data

US 2006/0042747 A1 Mar. 2, 2006

(30) Foreign Application Priority Data

Aug. 30, 2004 (KR) .................. 10-2004-0068775

(51) Int. Cl.
*B32B 37/00* (2006.01)
(52) U.S. Cl. .................. 156/382; 156/581; 156/582; 269/21
(58) Field of Classification Search .................. 156/285, 156/381, 382, 538, 539, 556, 581, 582; 269/21; 100/210
See application file for complete search history.

(56) References Cited

U.S. PATENT DOCUMENTS

| 4,262,594 | A | * | 4/1981 | Landsman | 101/389.1 |
| 4,337,116 | A | * | 6/1982 | Foster et al. | 162/158 |
| 5,076,880 | A | * | 12/1991 | Spengler et al. | 156/382 |
| 5,098,508 | A | * | 3/1992 | Mattil | 156/363 |
| 5,106,450 | A | * | 4/1992 | Freisitzer et al. | 156/517 |
| 5,273,615 | A | * | 12/1993 | Asetta et al. | 156/584 |
| 6,189,589 | B1 | * | 2/2001 | Tokunaga et al. | 156/497 |
| 6,297,075 | B1 | | 10/2001 | Odajima et al. | |
| 6,561,249 | B2 | * | 5/2003 | Huber | 156/581 |
| 6,626,225 | B1 | * | 9/2003 | Kochberger | 156/581 |
| 2005/0183669 | A1 | * | 8/2005 | Parkhe et al. | 118/724 |

FOREIGN PATENT DOCUMENTS

| CN | 1348552 | 5/2002 |
| CN | 1428817 | 7/2003 |
| CN | 1494485 | 5/2004 |
| JP | 2001-210469 | 8/2001 |
| JP | 2003-197372 | 7/2003 |
| JP | 2003-308974 | 10/2003 |
| JP | 2004-079540 | 3/2004 |
| JP | 2006-511922 | 4/2006 |
| KR | 1020030076017 | 9/2003 |

OTHER PUBLICATIONS

Chinese Office Action dated May 30, 2008.
Chinese Office Action dated Feb. 6, 2009 for CN Application No. 200410095473.0.

* cited by examiner

*Primary Examiner*—James Sells
(74) *Attorney, Agent, or Firm*—H.C. Park & Associates, PLC

(57) ABSTRACT

A lamination apparatus and a laser-induced thermal imaging method using the same are provided. The lamination apparatus comprising: a chuck for fixing first and second substrates; and having at least one vacuum hole located therein and exposed outside of the first substrate therein.

12 Claims, 4 Drawing Sheets

LAMINATION APPARATUS AND LASER-INDUCED THERMAL IMAGING METHOD USING THE SAME

CROSS-REFERENCE TO RELATED APPLICATION

This application claims priority to and the benefit of Korean Patent Application No. 2004-68775, filed Aug. 30, 2004, the disclosure of which is incorporated herein by reference in its entirety.

BACKGROUND OF THE INVENTION

1. Field of the Invention

The present invention relates to a lamination apparatus and a laser-induced thermal imaging (LITI) method using the same and, more particularly, to a lamination apparatus for performing a lamination process of a donor substrate in an inert gas atmosphere and an LITI method using the same.

2. Description of the Related Art

Since an organic light emitting display (OLED) among flat panel displays has a fast response speed of not more than 1 ms, low power consumption, and a wide viewing angle due to an emissive display, the OLED has an advantage as a medium for displaying a moving picture regardless of device size. In addition, since the OLED may be fabricated at low temperature and may be readily fabricated on the basis of conventional semiconductor manufacturing processes, the OLED is attracting public attention as a next generation flat panel display.

The OLED is generally classified into a polymer device using a wet process and a small molecular device using a deposition process depending on materials and processes for fabricating an organic light emitting diode.

In the case of the polymer OLED, the device is manufactured by depositing an organic layer having an emission layer on a substrate having a pixel electrode using an inkjet printing method or a spin coating method, and forming an opposite electrode.

In addition, in the case of the small molecular OLED, the device is completed by depositing an organic layer having an emission layer on a substrate having a pixel electrode using a deposition method, and forming an opposite electrode.

In the case of the inkjet printing method among methods of patterning the polymer and small molecular weight emission layers, organic layers except for an emission layer should be made of restricted materials, and there should be a troublesome process of forming a structure for inkjet printing on a substrate.

In addition, when the emission layer is patterned using a deposition process, it may be difficult to manufacture a large-sized display due to use of a metal mask.

In order to substitute for the patterning method, a laser-induced thermal imaging (LITI) method has been recently developed.

The LITI method is a method of converting a laser emitting from a light source to heat energy, and transferring a pattern forming material to a corresponding substrate using the converted heat energy to form a pattern. In order to perform the LITI method, a donor substrate, at which a transfer layer is formed, a light source, and a substrate as a subject are required.

In performing the LITI method, the donor substrate has a shape of covering the entire substrate as a receptor, and the donor substrate and the substrate are fixed on a stage.

Then, the fixed substrate is subjected to a laminating operation, and bubbles or misalignment may occur between the donor substrate and the substrate due to poor adhesion there between when the substrate and the donor substrate are moved along the lamination direction during the laminating operation. As a result, there may be problems while patterning an emission layer.

In addition, there may be problems that particles are introduced from the exterior into a chamber where the stage is located. The particles exist on the transfer layer to generate failures of the display device such as spots or pixel defects in an emission region, and deteriorate display performance.

SUMMARY OF THE INVENTION

The present invention, therefore, solves aforementioned problems associated with conventional devices by providing a lamination apparatus capable of improving lamination characteristics and patterning characteristics of an LITI process by improving a method of fixing a donor substrate and a substrate in a heat transfer apparatus.

It is another aspect of the present invention to provide a lamination apparatus and an LITI method using the same capable of preventing particles from the exterior from introducing into a stage, at which a donor substrate and a receptor substrate are located, and a chamber, in which the stage exists, thereby preventing failures of the OLED from generating.

In an exemplary embodiment of the present invention, A lamination apparatus comprising: a chuck for fixing first and second substrates; and having at least one first vacuum hole located therein and exposed outside of the first substrate therein.

The chuck located in atmospheric-pressure inert-gas atmosphere.

In another exemplary embodiment according to the present invention, An LITI method includes: locating a substrate on a chuck; aligning a donor substrate on the substrate; and fixing the donor substrate and the substrate using at least one first vacuum hole located in the chuck and outside of the substrate.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Figure 1:
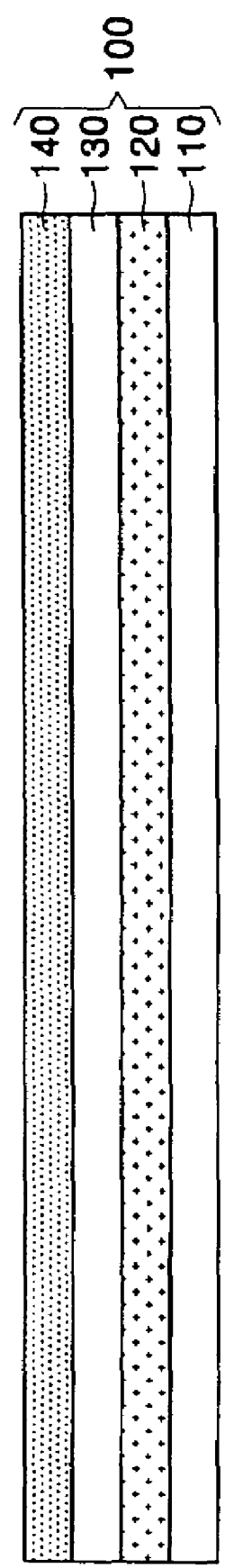
FIG. 1 is a cross-sectional view of a donor substrate.

The present invention will now be described more fully hereinafter with reference is to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like reference numerals designate like elements throughout the specification.

Hereinafter, a lamination apparatus and an LITI method using the same in accordance with an embodiment of the present invention will be described with reference to FIGS. 1 to 4.

FIG. 1 is a cross-sectional view of a donor substrate in accordance with an embodiment of the present invention.

The donor substrate 100 has a structure that a plurality of layers are formed on a base substrate 110, which includes the base substrate 110, a light-heat conversion layer 120 disposed on the base substrate 110, and a transfer layer 140 disposed on the light-heat conversion layer 120.

First, the base substrate 110 is prepared. The base substrate 110 may be framed, and may be made of flexible material or solid material.

Preferably, the base substrate 110 has a thickness of about 20~200 μm, since it may be difficult to handle the base substrate 110 when it is too thin, and difficult to transport the donor substrate 100 due to its heavy weight when the base substrate 100 is too thick.

The light-heat conversion layer 120 is formed on the base substrate 110, and the transfer layer 140 is formed on the light-heat conversion layer 120.

The light-heat conversion layer 120 functions to convert a laser irradiated from a laser irradiator to heat energy, and the heat energy functions to transfer the transfer layer onto the substrate as a receptor by changing adhesion between the transfer layer 140 and the light-heat conversion layer 120.

A buffer layer 130 may be interposed between the light-heat conversion layer 120 and the transfer layer 140 in order to effectively adjust adhesion between the transfer layer 140 and the donor substrate.

The transfer layer 140 may be an emission layer of the OLED. Further, the transfer layer 140 may further include at least one layer selected from a group consisting of a hole injection layer, a hole transport layer, a hole blocking layer, and an electron injection layer.

In addition, the transfer layer 140 may be formed of a polymer organic layer or a small molecular organic layer.

Figure 2:
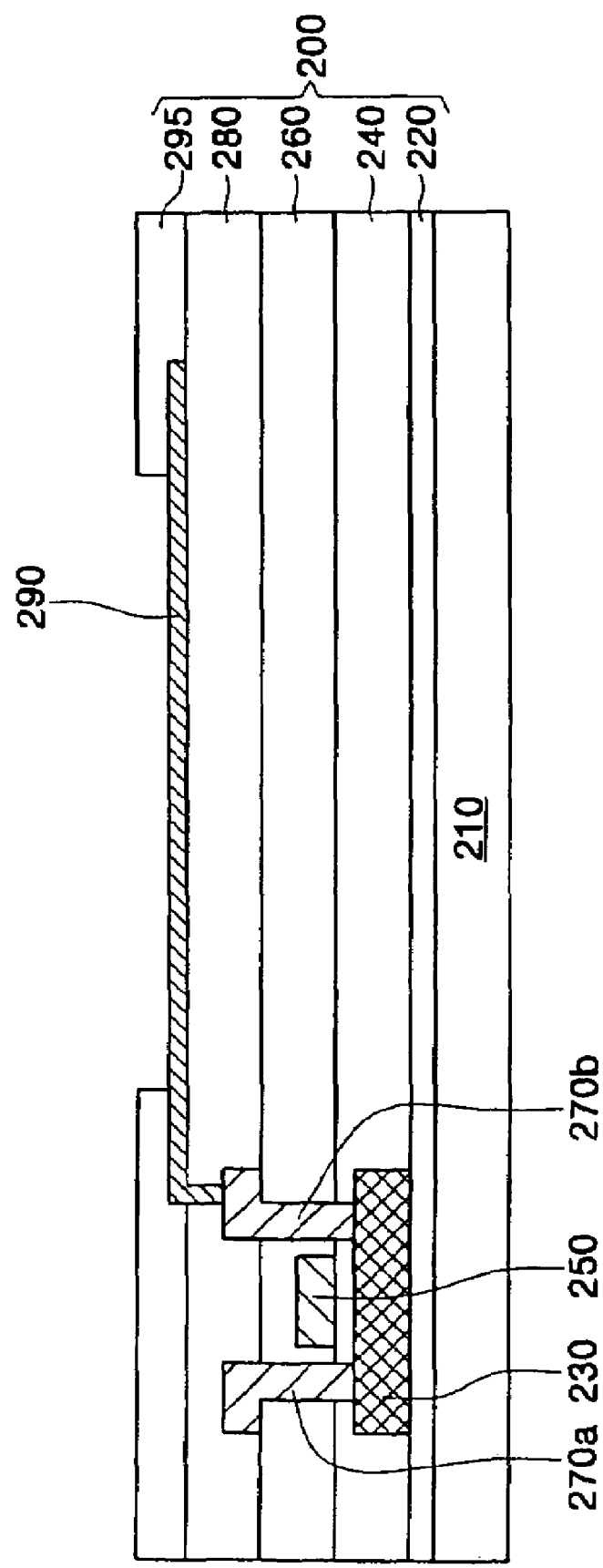
FIG. 2 is a cross-sectional view of a unit pixel in which predetermined layers are formed on a substrate.

FIG. 2 is a cross-sectional view of a unit pixel, in which predetermined layers are formed on the substrate.

Forming the predetermined layers on the substrate may include forming a thin film transistor (TFT) having a gate electrode, a source electrode and a drain electrode, forming a pixel electrode layer connected to the TFT, and forming a pixel defining layer.

Referring to FIG. 2, a semiconductor layer 230 is formed on the substrate 210. A buffer layer 220 may be interposed between the substrate 210 and the semiconductor layer 230 in order to prevent impurities existing on the substrate 210 from infiltrating the semiconductor layer 230.

A gate insulating layer 240 is formed on the semiconductor layer 230, and a gate electrode 250 is formed on the gate insulating layer 240. An interlayer insulating layer 260 is is formed on the gate electrode 250 using a typical material, and contact holes for exposing source and drain regions of the semiconductor layer 230 are formed in the interlayer insulating layer 260, respectively. Source and drain electrodes 270a and 270b respectively in contact with the exposed source and drain regions are formed by depositing and patterning a conductive layer on the interlayer insulating layer 260.

A planarization layer 280 is formed on the substrate having the source and drain electrodes 270a and 270b, and a via-hole is formed in the planarization layer 280, thereby exposing the drain electrode 270b under the via-hole.

In addition, before forming the planarization layer 280, an inorganic passivation layer may be formed in order to protect the lower layers from moisture, impurities, and an etching process among the processes.

A conductive layer is deposited and patterned on the planarization layer 280 having the via-hole to form a pixel electrode 290. A pixel defining layer 295 for exposing the pixel electrode 290 is formed on the pixel electrode 290 to define a region, at which an organic layer is to be formed in the unit pixel.

Figure 3:
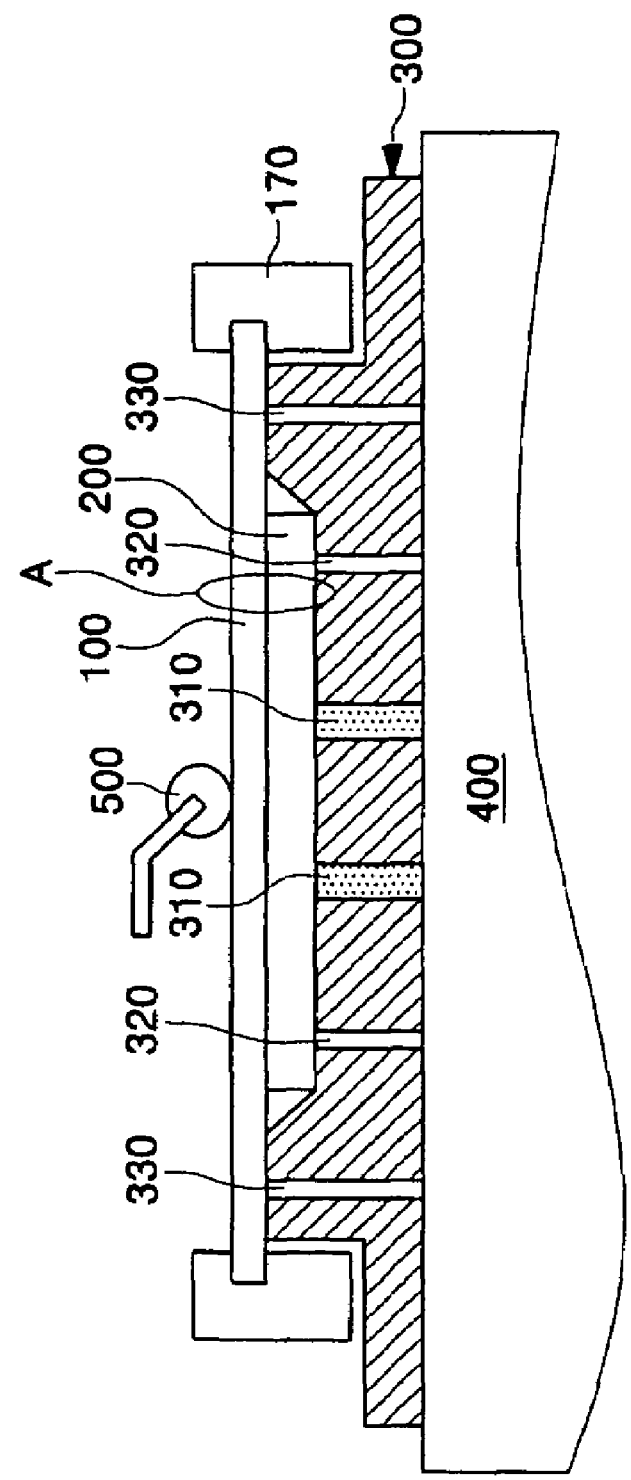
FIG. 3 is a cross-sectional view of a lamination apparatus in accordance with an embodiment of the present invention.

FIG. 3 is a cross-sectional view of a lamination apparatus in accordance with an embodiment of the present invention.

Referring to FIG. 3, a stage 400 is located in a chamber, and a chuck 300 for fixing first and second substrates is located on the stage 400. The chuck 300 includes at least one first vacuum hole 330. The first vacuum hole 330 is under the donor substrate 330 but not under the first substrate 200. In addition, the chuck 300 includes at least one second vacuum hole 320 under the first substrate 200. Further, at least one lift pin 310 is located at a region where the first substrate 200 of the chuck 300 is located.

The first substrate may be a receptor substrate, and the second substrate may be a donor substrate.

Specifically describing, the first vacuum hole 330 makes a space between the chuck 300 and the donor substrate 100 into a vacuum state to fix the donor substrate 100. And, by fixing the donor substrate 100, the substrate 200 located under the donor substrate 100 is fixed.

In addition, the second vacuum hole 320 located under the substrate 200 makes a space between the chuck 300 and the substrate 200 into a vacuum state to fix the substrate 200. Preferably, the donor substrate 100 is larger than the substrate 200. The donor substrate may have a frame 170. Namely, the donor substrate may be a framed substrate.

The donor substrate 100 and the substrate 200 may be strongly adhered to each other during a lamination process as both substrates are fixed using the first vacuum hole. In addition, because of the second vacuum hole under the substrate 200, the substrate 200 may be more strongly fixed. As a result, it is possible to improve problems that bubbles occur during the lamination process, and problems that misalignment occurs during a pressing operation for the lamination, thereby further improving patterning characteristics of an emission layer during laser transferring.

The lift pin 310 functions to detach the substrate 200 from the chuck 300 after the lamination process.

The lamination process is performed by a pressing method using a roller, a gas pressure, or a crown press. The lamination process may be performed in the outward direction from the center. In addition, the lamination process may be performed in one-way.

Since the outward lamination may effectively prevent bubbles from occurring between the donor substrate 100 and the substrate 200, the outward lamination is more preferable.

Since the lamination process is performed in an atmospheric-pressure inert-gas atmosphere to suppress introduction of external particles, it is possible to prevent problems occurred due to the particles existing on the conventional emission layer, for example, failures of the display device such as spots or pixel defects in an emission region.

Figure 4:
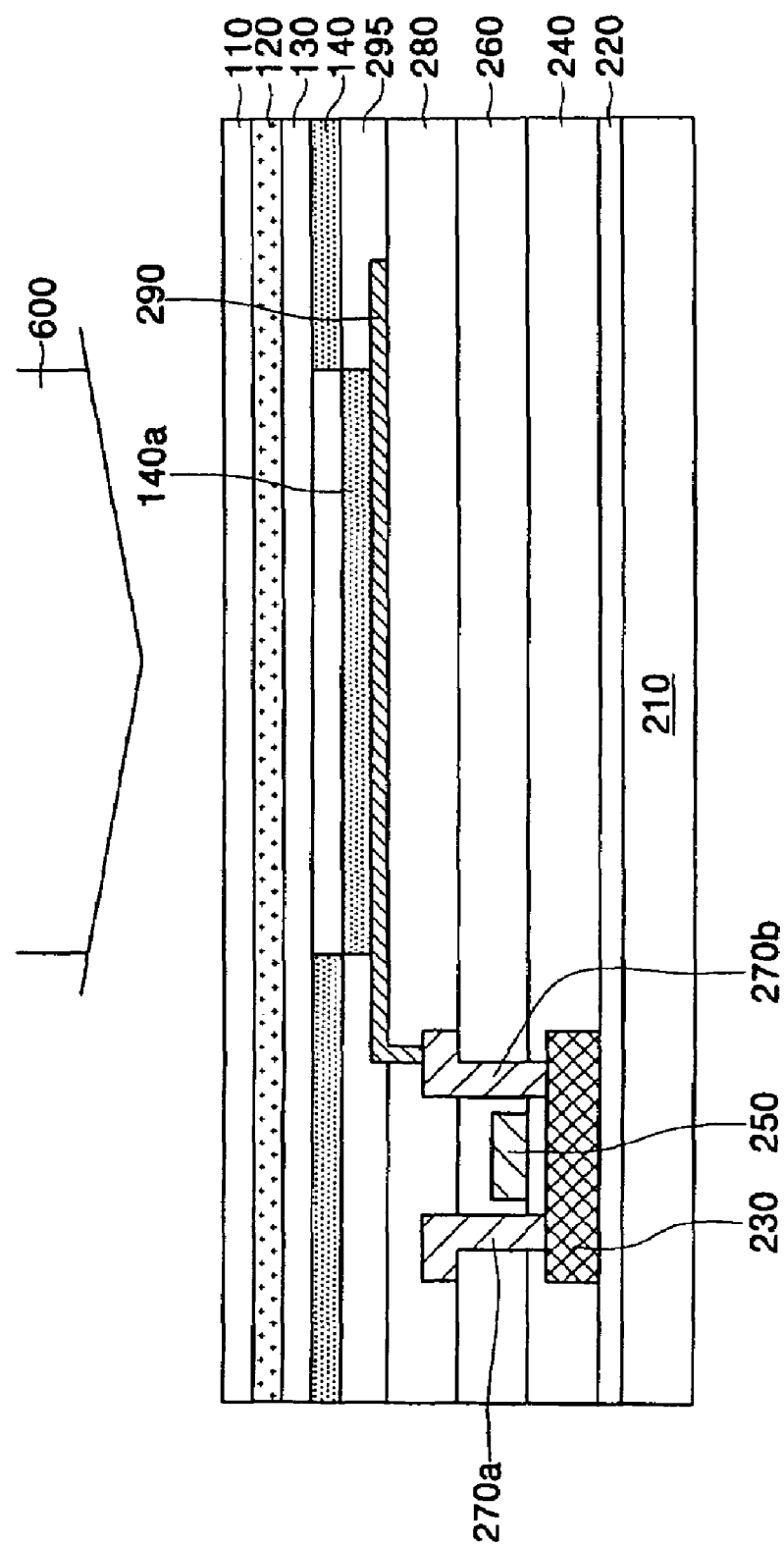
FIG. 4 is a cross-sectional view of a unit pixel, for describing an LITI process after laminating the portion A in FIG. 3.

FIG. 4 is a cross-sectional view of a unit pixel, for describing an LITI process after laminating the portion A in FIG. 3.

Referring to FIG. 4, after the substrate 200 and the donor substrate 100 are adhered to each other by the lamination process, a laser 600 is irradiated on a region that is to be patterned.

In the region where the laser 600 is irradiated, the adhesion between the transfer layer 140a and the pixel electrode 290 becomes larger than that between the buffer layer 130 and the transfer layer 140 to delaminate the transfer layer 140a, on which the laser was irradiated, from the buffer layer 130, thereby patterning the transfer layer on the pixel electrode 290.

The patterned transfer layer 140a may be patterned in a stripe type or a delta type depending on types of the unit pixel.

The substrate 200, passed through the patterning process, is removed from the donor substrate 100, detached from the chuck 300 using the lift pin 310, and then moved to another stage. Then, an opposite electrode is formed on the patterned organic layer to complete the OLED.

As can be seen from the foregoing, the lamination apparatus and the LITI method using the same is capable of improving problems that bubbles and misalignment occur during the lamination process, by employing the chuck having the vacuum hole to more securely fix the donor substrate and the substrate during the lamination process and therefore to strengthen the adhesion between the both substrates.

In addition, the present invention is capable of suppressing the external particles from introducing into the emission layer and the pixel electrode and therefore preventing the failures of the display device such as spots or pixel defects in an emission region of the OLED, by performing the lamination process in the atmospheric-pressure inert-gas atmosphere.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A lamination apparatus comprising:
    a chuck for fixing first and second substrates; and having at least one vacuum hole located therein and exposed outside of the first substrate therein, the at least one vacuum hole adapted to make a space between the chuck and the second substrate into a vacuum state to thereby fix a planar surface of the second substrate to both a first surface of the chuck and a planar surface of the first substrate and fix the first substrate to a second surface of the chuck,
    wherein the first surface and the second surface are on different planes and are connected by a first third surface and a second third surface, the second surface being a continuous planar surface the first third surface and the second third surface, and
    wherein the first third surface and the second third surface are inclined with respect to the first surface and the second surface.

2. The lamination apparatus according to claim 1, wherein the chuck further includes at least one second vacuum hole located under the first substrate.

3. The lamination apparatus according to claim 1, wherein the chuck located in atmospheric-pressure inert-gas atmosphere.

4. The lamination apparatus according to claim 2, wherein the vacuum hole makes a space between the chuck and the first substrate into a vacuum state to fix the first substrate.

5. The lamination apparatus according to claim 1, further comprising at least one lift pin existing in the chuck.

6. The lamination apparatus according to claim 5, wherein the lift pin functions to detach the first substrate from the chuck after a lamination process.

7. The lamination apparatus according to claim 1, wherein a lamination process is performed on the second substrate by any one of a roller, a gas pressure, and a crown press.

8. The lamination apparatus according to claim 7, wherein the lamination process is performed in an outward direction from a center.

9. The lamination apparatus according to claim 7, wherein the lamination process is performed in one-way.

10. The lamination apparatus according to claim 1, wherein the second substrate is larger than the first substrate.

11. The lamination apparatus according to claim 1, wherein the second substrate is a framed substrate.

12. The lamination apparatus according to claim 1, wherein the first substrate is a receptor substrate, and the second substrate is a donor substrate.

* * * * *